(12) United States Patent
Lee et al.

(10) Patent No.: US 9,659,856 B2
(45) Date of Patent: May 23, 2017

(54) TWO STEP METALLIZATION FORMATION

(71) Applicant: Taiwan Semiconductor Manufacturing Company, Ltd., Hsin-Chu (TW)

(72) Inventors: Ya-Lien Lee, Baoshan Township (TW); Chun-Chieh Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/523,256

(22) Filed: Oct. 24, 2014

(65) Prior Publication Data

US 2016/0118335 A1  Apr. 28, 2016

(51) Int. Cl.
| | | |
|---|---|---|
| *H01L 23/522* | (2006.01) | |
| *H01L 21/768* | (2006.01) | |
| *H01L 23/532* | (2006.01) | |
| *H01L 23/48* | (2006.01) | |
| *H01L 21/4763* | (2006.01) | |

(52) U.S. Cl.
CPC ...... *H01L 23/5222* (2013.01); *H01L 21/7682* (2013.01); *H01L 21/76813* (2013.01); *H01L 21/76831* (2013.01); *H01L 21/76844* (2013.01); *H01L 21/76855* (2013.01); *H01L 21/76879* (2013.01); *H01L 23/53238* (2013.01); *H01L 23/53266* (2013.01); *H01L 23/53295* (2013.01); *H01L 2924/0002* (2013.01)

(58) Field of Classification Search
CPC ......... H01L 21/76805; H01L 21/76807; H01L 21/76814; H01L 21/76844; H01L 21/76846; H01L 21/76849; H01L 23/5226; H01L 23/53238

USPC ............... 257/751, 298, 741, 774, E23.011, 257/E23.154, E23.161
See application file for complete search history.

(56) References Cited

U.S. PATENT DOCUMENTS

| | | |
|---|---|---|
| 8,354,751 B2 | 1/2013 | Horak et al. |
| 9,252,049 B2 | 2/2016 | Peng et al. |
| 2003/0071355 A1 | 4/2003 | Dubin et al. |

(Continued)

FOREIGN PATENT DOCUMENTS

| | | |
|---|---|---|
| JP | 2009302501 A | 12/2009 |
| TW | I402936 B | 7/2013 |

(Continued)

OTHER PUBLICATIONS

Yang, C.-C. et al., "Extendibility of PVD Barrier/Seed for BEOL Cu Metallization," Proceedings of the IEEE 2005 Interconnect Technology Conference, Jun. 6-8, 2005, pp. 135-137.

*Primary Examiner* — Kimberly Rizkallah
*Assistant Examiner* — Brian Turner
(74) *Attorney, Agent, or Firm* — Slater Matsil, LLP

(57) ABSTRACT

An integrated circuit structure includes a first conductive line, a dielectric layer over the first conductive line, a diffusion barrier layer in the dielectric layer, and a second conductive line in the dielectric layer. The second conductive line includes a first portion of the diffusion barrier layer. A via is underlying the second conductive line and electrically couples the second conductive line to the first conductive line. The via includes a second portion of the diffusion barrier layer, with the second portion of the diffusion barrier layer having a bottom end higher than a bottom surface of the via.

20 Claims, 14 Drawing Sheets

(56) References Cited

U.S. PATENT DOCUMENTS

| | | | |
|---|---|---|---|
| 2003/0087514 A1* | 5/2003 | Tang | H01L 21/76808 438/630 |
| 2005/0112864 A1* | 5/2005 | Clevenger | H01L 21/76805 438/622 |
| 2006/0019485 A1* | 1/2006 | Komai et al. | 438/627 |
| 2007/0202689 A1* | 8/2007 | Choi et al. | 438/637 |
| 2007/0267751 A1 | 11/2007 | Yang et al. | |
| 2008/0044999 A1 | 2/2008 | Dubin et al. | |
| 2009/0115061 A1* | 5/2009 | Chen | 257/751 |
| 2009/0206485 A1* | 8/2009 | Yang et al. | 257/751 |
| 2009/0309226 A1* | 12/2009 | Horak et al. | 257/762 |
| 2011/0100697 A1* | 5/2011 | Yang et al. | 174/262 |
| 2013/0119547 A1* | 5/2013 | Kim et al. | 257/751 |
| 2014/0183738 A1 | 7/2014 | Jezewski et al. | |

FOREIGN PATENT DOCUMENTS

| | | |
|---|---|---|
| TW | 201431019 A | 8/2014 |
| TW | 201436002 A | 9/2014 |

\* cited by examiner

TWO STEP METALLIZATION FORMATION

BACKGROUND

Integrated circuit devices such as transistors are formed on semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias in a low-k dielectric layer, the low-k dielectric layer is first etched to form trenches and via openings. The etching of the low-k dielectric layer may involve forming a patterned hard mask over the low-k dielectric material, and using the patterned hard mask as an etching mask to form trenches. Via openings are also formed and substantially aligned to the trenches. The trenches and the via openings are then filled with a metallic material, which may comprise copper. A Chemical Mechanical Polish (CMP) is then performed to remove excess portions of the metallic material over the low-k dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
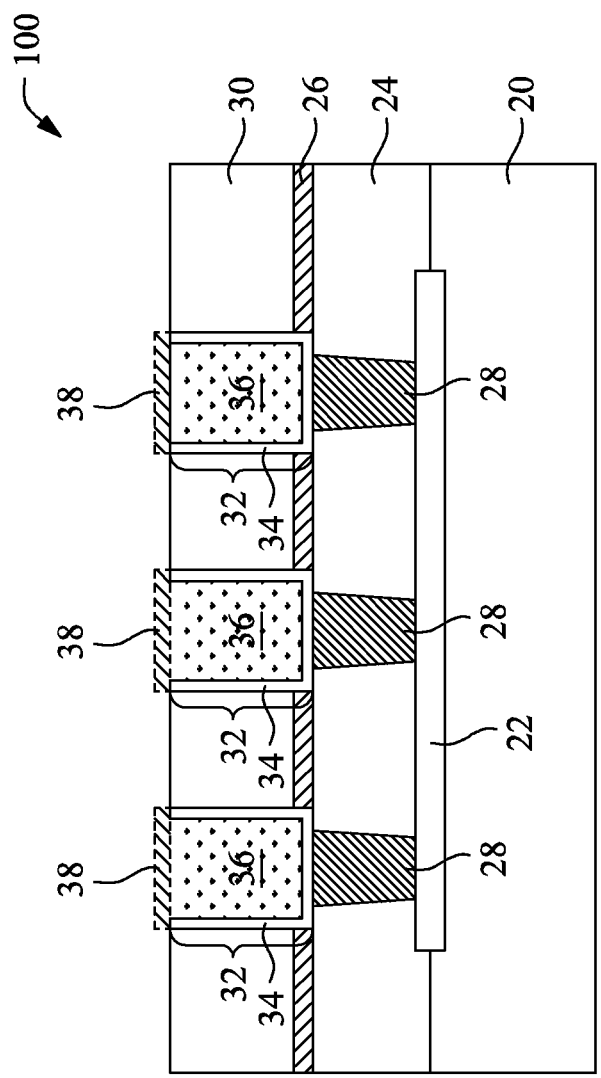
FIGS. 1 through 13 illustrate the cross-sectional views of intermediate stages in the formation of an interconnect structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures of integrated circuits and the methods of forming the same are provided in accordance with various exemplary embodiments. The intermediate stages of forming the interconnect structures are illustrated. The variations of the embodiments are discussed. Throughout the various views and illustrative embodiments, like reference numbers are used to designate like elements.

FIGS. 1 through 13 illustrate the cross-sectional views of intermediate stages in the formation of interconnect structures of integrated circuits in accordance with some embodiments. The steps shown in FIGS. 1 through 13 are also shown in the process flow 200 in FIG. 14.

FIG. 1 illustrates wafer 100, which includes semiconductor substrate 20 and the features formed over semiconductor substrate 20. In accordance with some embodiments of the present disclosure, semiconductor substrate 20 comprises crystalline silicon, crystalline germanium, silicon germanium, a III-V compound semiconductor such as GaAsP, AlInAs, AlGaAs, GaInAs, GaInP, GaInAsP, and/or the like. Semiconductor substrate 20 may also be a bulk silicon substrate or a Silicon-On-Insulator (SOI) substrate.

In accordance with some embodiments of the present disclosure, wafer 100 is used to form a device die. In these embodiments, integrated circuit devices 22 are formed on the top surface of semiconductor substrate 20. Exemplary integrated circuit devices 22 may include Complementary Metal-Oxide Semiconductor (CMOS) transistors, resistors, capacitors, diodes, or the like. The details of integrated circuit devices 22 are not illustrated herein. In alternative embodiments, wafer 100 is used for forming interposers. In these embodiments, no active devices such as transistors and diodes are formed on substrate 20. There may (or may not) be passive devices such as capacitors, resistors, inductors, or the like formed in wafer 100. Substrate 20 may also be a dielectric substrate in the embodiments in which wafer 100 is an interposer wafer. Furthermore, through-vias (not shown) may be formed to penetrate through substrate 20 in order to interconnect the components on the opposite sides of substrate 20.

Inter-Layer Dielectric (ILD) 24 is formed over semiconductor substrate 20 and fills the space between the gate stacks of transistors (not shown) in integrated circuit devices 22. In some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In alternative embodiments of the present disclosure, ILD 24 is formed using a deposition method such as Plasma Enhanced Chemical Vapor Deposition (PECVD), Low Pressure Chemical Vapor Deposition (LPCVD), or the like.

As also shown in FIG. 1, etch stop layer 26 is formed over ILD 24 and integrated circuit devices 22, if any. Etch stop layer 26 may comprise silicon carbide, silicon nitride, silicon oxynitride, silicon carbo-nitride, or the like. Etch stop layer 26 is formed of a material that has a high etching selectivity with the overlying dielectric layer 30, and hence etch stop layer 26 may be used to stop the etching of dielectric layer 30.

Contact plugs 28 are formed in ILD 24 and are used to electrically connect to integrated circuit devices 22. For example, contact plugs 28 may include gate contact plugs that are connected to the gate electrodes of transistors (not shown) in integrated circuit devices 22 and source/drain contact plugs that are electrically connected to the source/drain regions of the transistors. In accordance with some embodiments of the present disclosure, contact plugs 28 are formed of a material selected from tungsten, aluminum, copper, titanium, tantalum, titanium nitride, tantalum nitride, alloys therefore, and/or multi-layers thereof. The formation of contact plugs 28 may include etching ILD 24 to form contact openings, filling a conductive material(s) into the contact openings until the conductive material fills the entireties of the contact openings, and performing a planarization (such as Chemical Mechanical Polish (CMP)) to level the top surfaces of contact plugs 28 with the top surface of ILD 24.

Further illustrated in FIG. 1 is dielectric layer 30, which is alternatively referred to as Inter-Metal Dielectric (IMD) layer 30 hereinafter. In accordance with some embodiments of the present disclosure, IMD layer 30 is formed of a low-k dielectric material having a dielectric constant (k-value) lower than about 3.0, about 2.5, or even lower. IMD layer 30 may comprise Black Diamond (a registered trademark of Applied Materials), an oxygen-containing and/or carbon containing low-k dielectric material, Hydrogen SilsesQuioxane (HSQ), MethylSilsesQuioxane (MSQ), or the like.

Conductive lines 32 are formed in IMD 30. In accordance with some embodiments, conductive lines 32 include diffusion barrier layers 34 and copper-containing material 36 over diffusion barrier layers 34. Diffusion barrier layers 34 may include titanium, titanium nitride, tantalum, tantalum nitride, or the like, and have the function of preventing copper in copper-containing material 36 from diffusing into IMD 30. Conductive lines 32 are referred to as metal lines 32 hereinafter.

In accordance with some embodiments of the present disclosure, metal caps 38 are formed over metal lines 32. Metal caps 38 may also be considered as parts of metal lines 32 throughout the description. In some embodiments, metal caps 38 include cobalt (Co), CoWP, CoB, tungsten (W), tantalum (Ta), nickel (Ni), molybdenum (Mo), titanium (Ti), iron (Fe), or alloys thereof. Metal caps 38 may be formed selectively using ElectroChemical Plating (ECP) or electroless plating, during which wafer 100 is submerged in a plating solution. In alternative embodiments, metal caps 38 are blanket formed on metal lines 32 and IMD layer 30, followed by an etching process to remove undesirable portions. FIG. 1 illustrates that metal lines 32 are in a bottom metal layer, which is the metal layer immediately over contact plugs 28. The illustrated metal lines 32 also represent metal lines in any metal layer that is over the bottom metal layer.

Figure 2:
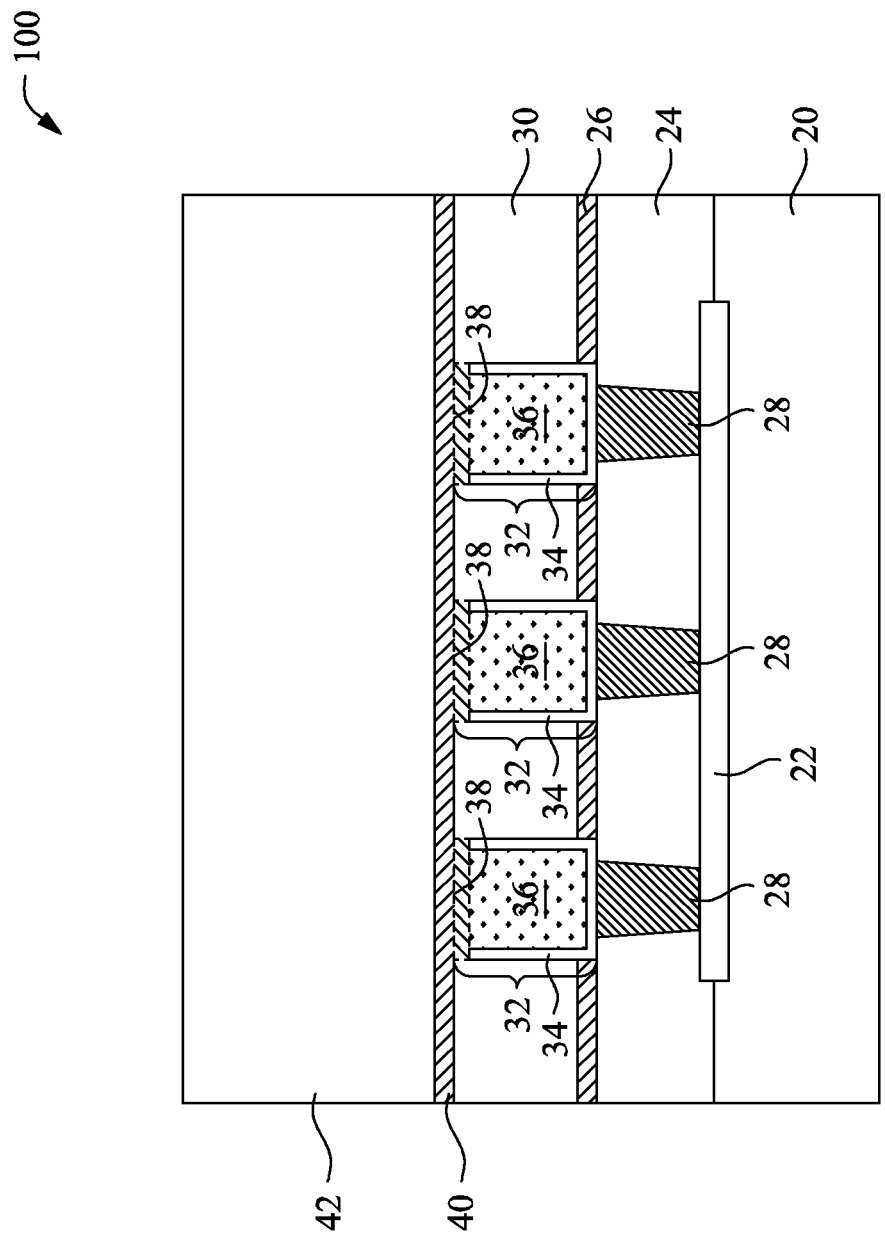

Referring to FIG. 2, etch stop layer 40 and IMD layer 42 are formed. In accordance with some embodiments, etch stop layer 40 is formed of silicon carbide, silicon nitride, silicon oxynitride, silicon carbo-nitride, or the like. Etch stop layer 40 is in contact with metal caps 38 and IMD layer 30. IMD layer 42 may be formed of a material that is selected from the same candidate materials for forming IMD layer 30. For example, IMD layer 42 may be formed of an oxygen-containing and/or carbon-containing dielectric material, Black Diamond, HSQ, MSQ, or the like. IMD layer 42 may also have a low-k value, which may be lower than about 3.0, 2.5, or 2.0. In some embodiments of the present disclosure, the formation of IMD layer 42 includes depositing a porogen-containing dielectric material and then performing a curing process to drive out the porogen, and hence the remaining IMD layer 42 becomes porous.

Figure 3:
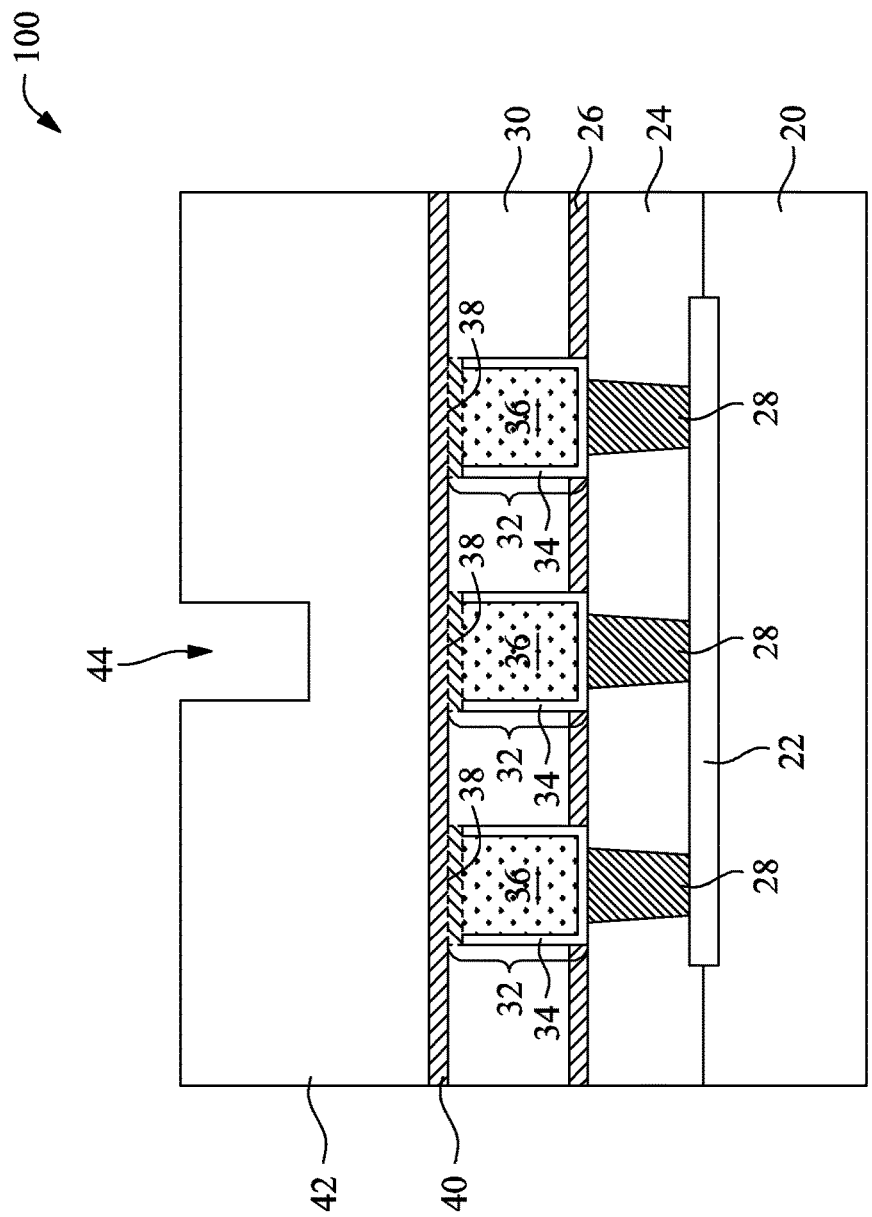
Figure 4:
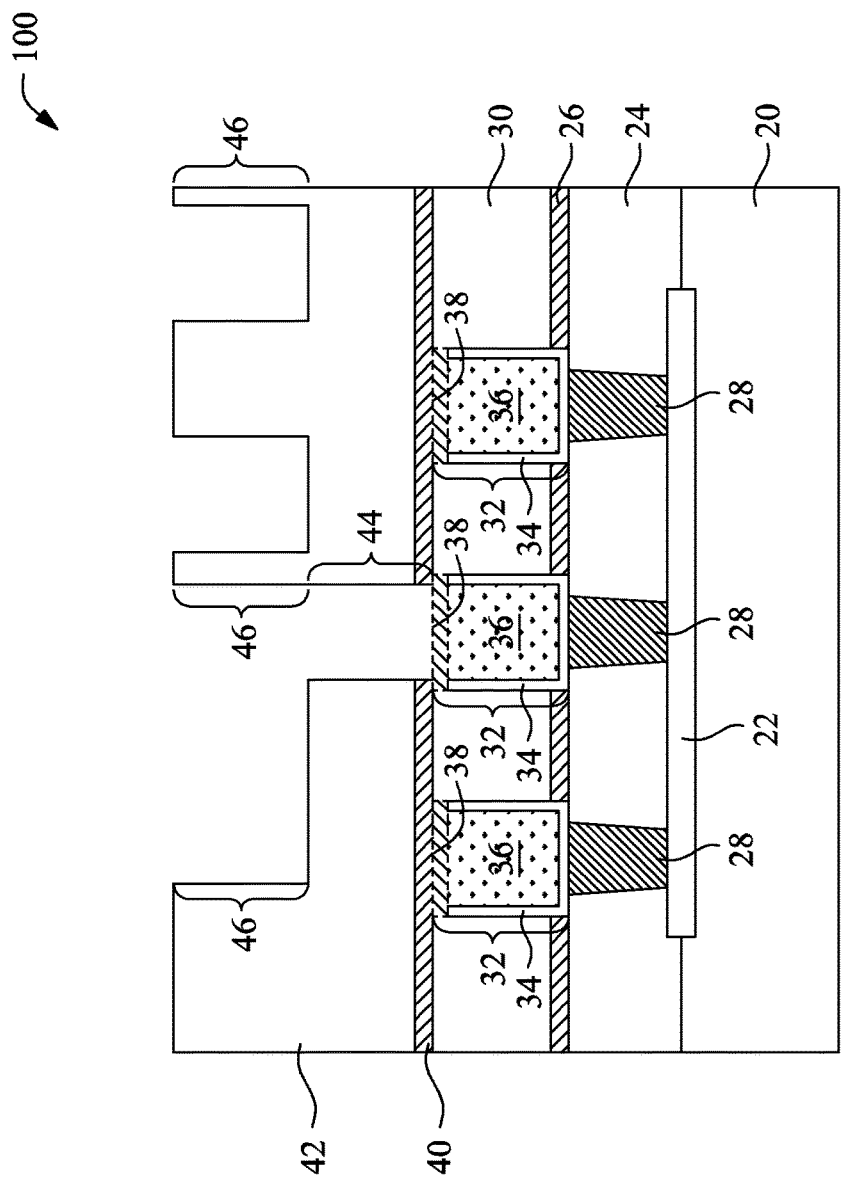

Referring to FIGS. 3 and 4, trenches 46 and via opening 44 are formed in IMD layer 42. The respective process steps are shown as step 202 in the process flow shown in FIG. 14. In accordance with some embodiments of the present disclosure, the formation processes include performing a photo lithography process to etch IMD layer 42 in order to form initial via opening such as the via opening 44 in FIG. 3, wherein the initial via opening 44 extends from the top surface of IMD layer 42 to an intermediate level between the top surface and the bottom surface of IMD layer 42. Next, a metal hard mask (not shown) is formed and patterned to define the patterns of trenches 46 as shown in FIG. 4. As shown in FIG. 4, an anisotropic etching is then performed to etch IMD layer 42 in order to form trenches 46. At the same time trenches 46 are formed, via opening 44 extends down to etch stop layer 40. Etch stop layer 40 is then etched to expose the underlying metal cap(s) 38, hence forming via opening 44 as illustrated. The etching step for forming trenches 46 may be performed using a time-mode, and may be stopped after the etching has been performed for a pre-set period of time. Other etch and stop point detection techniques are also contemplated. In alternative embodiments, via opening 44 and trenches 46 are formed in separate photo lithography processes. For example, in a first photo lithography process, trenches 46 are formed to extend to an intermediate level of IMD layer 42. In a second lithography process, via opening 44 is formed to extend all the way down to etch stop layer 40.

In accordance with some embodiments of the present disclosure, the etching of IMD layer 42 is performed using a process gas comprising fluorine and carbon, wherein fluorine is used for etching, with carbon protecting the sidewalls of the resulting via opening 44 and trenches 46. With an appropriate fluorine-to-carbon ratio, via openings 44 and trenches 46 may have desirable profiles. For example, the process gases for the etching include a fluorine and carbon containing gas(es) such as $C_4F_8$ and/or $CF_4$ and a carrier gas such as $N_2$. In alternative embodiments, the process gases for the etching include $CH_2F_2$ and a carrier gas such as $N_2$. During the etching of IMD layer 42, wafer 100 may be maintained at a temperature between about 30° C. and 60° C. The Radio Frequency (RF) power of the power source used for the etching may be lower than about 700 Watts, and the pressure of the process gases may be in the range from about 15 mtorr to about 30 mtorr.

After the formation of via opening 44 and trenches 46, metal line 32 or metal cap 38 (if any left) is exposed to via opening 44. Due to the bombardment effect in the formation of via opening 44, some portions of metal caps 38 may be removed in some embodiments, hence the underlying conductive material 36 may be exposed. In other embodiments, metal cap 38 includes a portion covering metal lines 32 after the formation of via opening 44.

Figure 5:
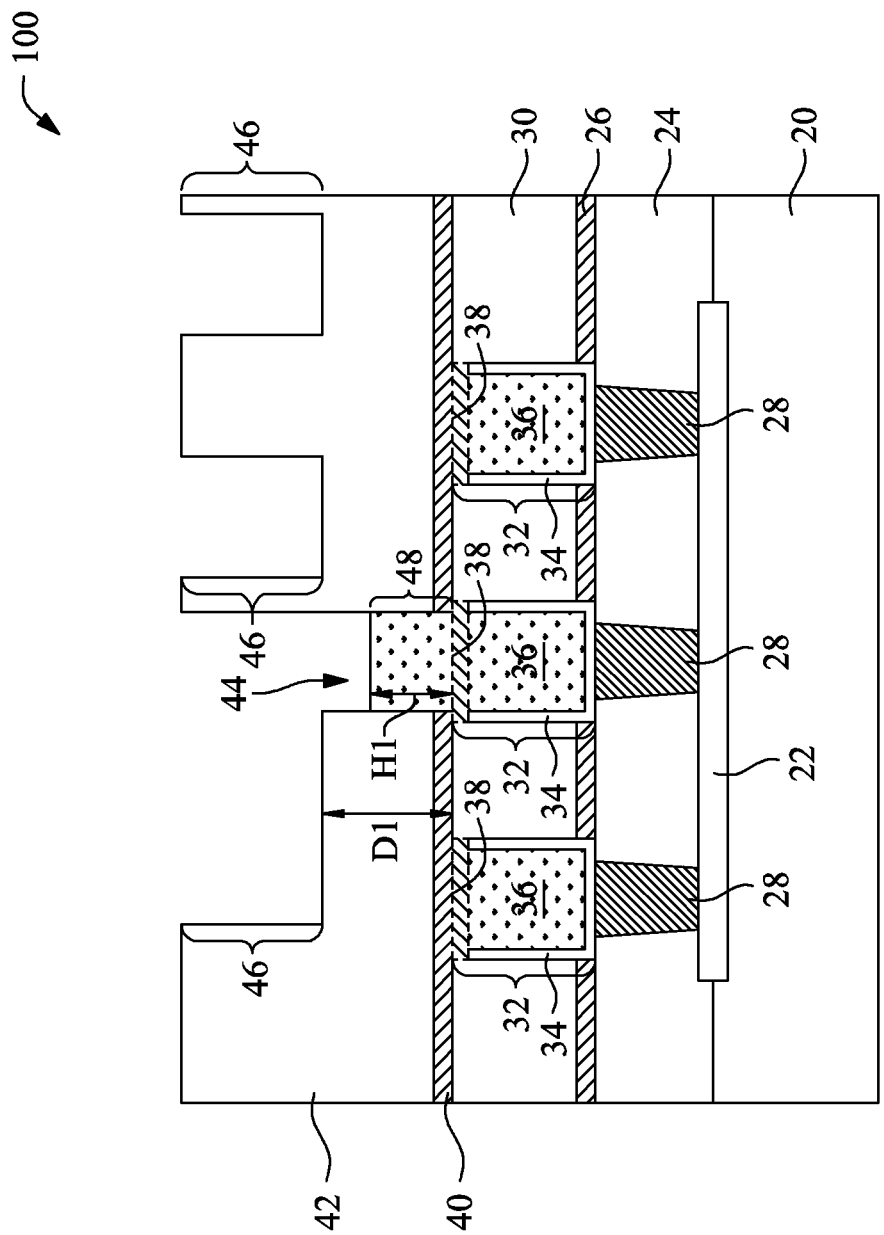

Referring to FIG. 5, a selective plating is performed to form via 48 in via opening 44, but not on the exposed surfaces of dielectric layer 42. The respective process step is shown as step 204 in the process flow shown in FIG. 14. In accordance with some embodiments of the present disclosure, the selective plating is performed using ECP. In accordance with alternative embodiments, the selective plating is performed using electroless plating. Via 48 includes a main metallic material doped with an additive element(s). The main metallic material may include copper, cobalt, or an alloy of copper and cobalt. In some exemplary embodiments, the atomic percentage of the main metallic material in via 48 is higher than about 80 percent, 90 percent, or even higher. The additive element may be a metallic element including manganese (Mn), magnesium (Mg), titanium (Ti), or alloys of these elements in different combinations.

Via opening 44 has depth D1, which is measured from the bottom surface of the respective trench 46 to the bottom of via openings 44. Height H1 of via 48 is smaller than depth D1 of via opening 44. Accordingly, the top surface of via 48 is lower than the bottom surfaces of trenches 46. In some embodiments, the difference (D1−H1) is greater than about 50 nm. Furthermore, ratio H1/D1 may be smaller than about ¾ to ensure there is enough difference between depth D1 and height H1.

Figure 6:
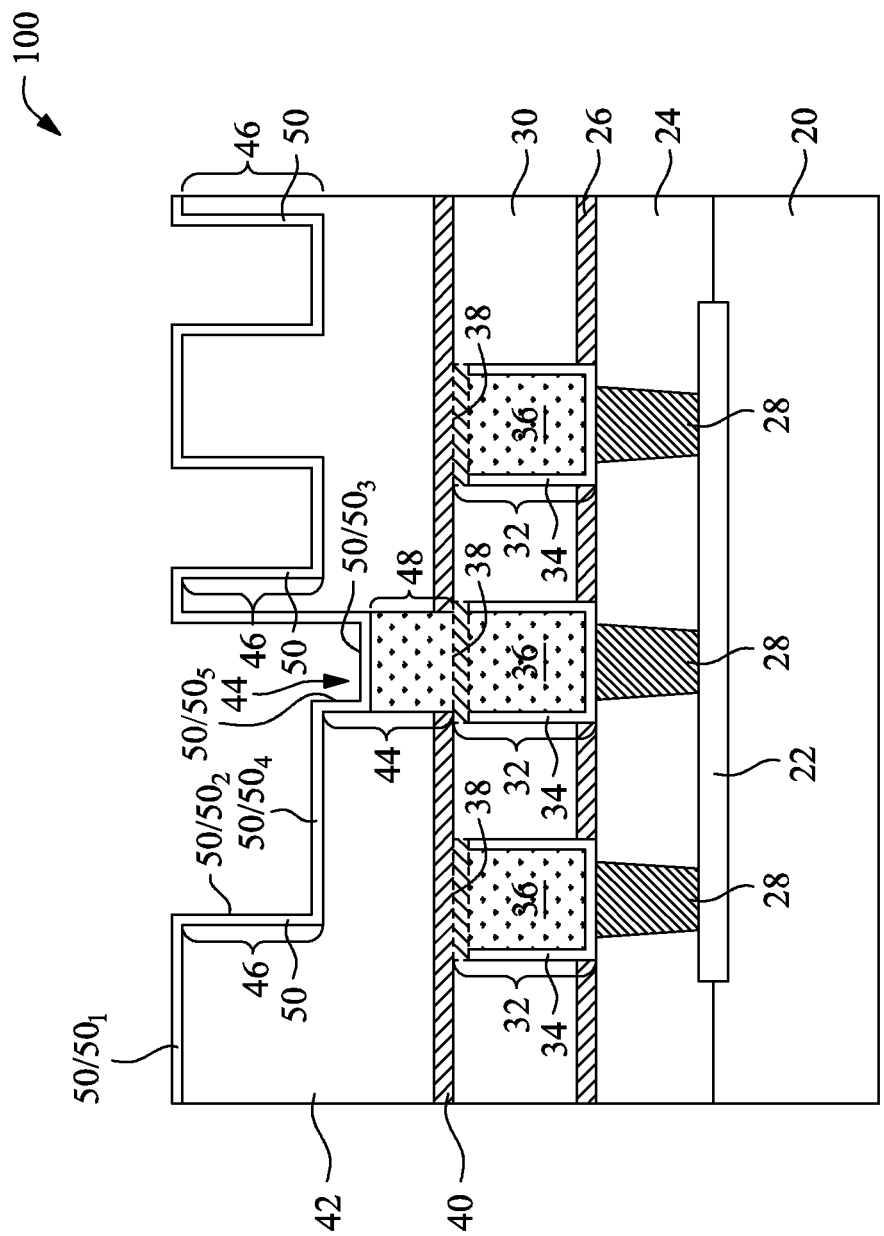

FIG. 6 illustrates the formation (the deposition) of diffusion barrier layer 50 on the exposed surface of wafer 100. The respective process step is shown as step 206 in the process flow shown in FIG. 14. In accordance with some embodiments, the formation of diffusion barrier layer 50 includes Physical Vapor Deposition (PVD). In some exemplary deposition process, argon (Ar) is introduced into the respective deposition chamber (not shown), in which wafer 100 is placed, to sputter metal ions (such as titanium or tantalum (Ta$^+$)) or atoms without charges (such as titanium or tantalum))(Ta$^0$)) from the respective target (not shown) used in the PVD. Nitrogen may be added into the process gases. The sputtered metal ions are deposited onto wafer 100, forming diffusion barrier layer 50, which is conductive. Diffusion barrier layer 50 may have a thickness in the range from about 2 nm to about 10 nm. In the deposition of diffusion barrier layer 50, a DC power and/or a Radio Frequency (RF) power may be applied.

Diffusion barrier layer 50 includes portions $50_1$ directly over low-k dielectric layer 42, portions $50_2$ on the sidewalls of trenches 46, portion $50_3$ at the bottom of via opening 44, portions $50_4$ on the bottoms of trenches 46, and portions $50_5$ on the sidewalls of via opening 44.

Figure 7:
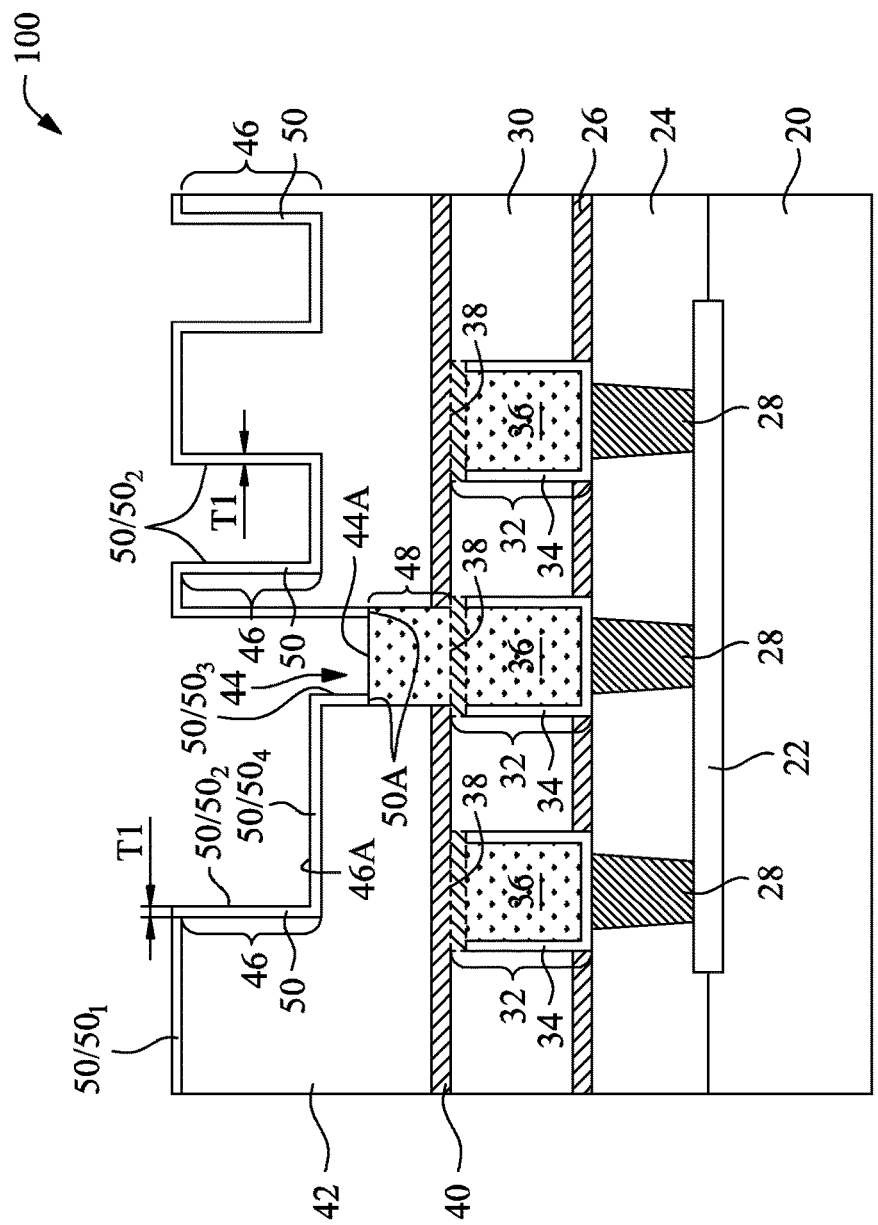

Referring to FIG. 7, a re-sputter of diffusion barrier layer 50 is performed, wherein some portions of diffusion barrier layer 50 are sputtered away. The respective process step is shown as step 208 in the process flow shown in FIG. 14. The re-sputter may be performed using the same production tool that is used for performing the step in FIG. 6. Furthermore, the step shown in FIG. 7 may be performed in-situ with the step shown in FIG. 6, with no vacuum break therebetween. In accordance with some embodiments of the present disclosure, the transition from the deposition of diffusion barrier layer 50 to the re-sputter of diffusion barrier layer 50 is achieved by adjusting process conditions. For example, the transition from the deposition of diffusion barrier layer 50 to the re-sputter of diffusion barrier layer 50 may be achieved by adjusting DC and RF power used in the deposition of diffusion barrier layer 50 to different values.

In some embodiments, the re-sputter of diffusion barrier layer 50 is performed by turning off or down the power of the DC power source, and turning on (if not turned on in the deposition of diffusion barrier layer 50) or up the power of the RF power source used in the deposition of diffusion barrier layer 50. In addition, the flow rate and/or the partial pressure of sputtering gases such as argon may be increased to enhance the re-sputtering effect. As a result, the re-sputter effect is enhanced. Metal ions (such as titanium or tantalum (Ta$^+$)) or atoms without charges (such as titanium or tantalum (Ta$^+$)) are sputter away from diffusion barrier layer 50.

In the resulting structure in FIG. 7, thickness T1 of sidewall portions $50_2$ of diffusion barrier layer 50 has a great value, which may be greater than bout 5 nm, and may be in the range from about 5 nm to about 10 nm. The advantageous features of the thick sidewall portions of diffusion barrier layer 50 are discussed in subsequent paragraphs.

As a result of the re-sputter, the bottom portion $50_3$ (FIG. 6) of diffusion barrier layer 50 is removed from the bottom of the remaining via opening 44, as shown in FIG. 7. The re-sputtered ions may be deposited on the top portions $50_1$ and sidewall portions $50_2$, causing the thickness of these portions to increase. In the meantime, portions $50_4$ of diffusion barrier layer 50 at the bottom of trenches 46 are also re-sputtered. However, at the time the ions are re-sputtered away from portions $50_4$, the re-sputtered ions are also deposited on portions $50_4$ simultaneously. Portions $50_4$ of diffusion barrier layer 50 hence remain after the re-sputter.

In accordance with the embodiments of the present disclosure, in order to ensure that diffusion barrier layer 50 is removed from the bottom of via opening 44, but not from the bottom of trenches 46, the bottom surface 44A of via opening 44 is lower than the bottom surface 46A of the respective trench. In the resulting structure, the bottom ends 50A of diffusion barrier layer 50 extend to the top surface of via 48. Hence, the bottom portion of the original via opening as in FIG. 4 is not filled with diffusion barrier layer 50.

Figure 8:
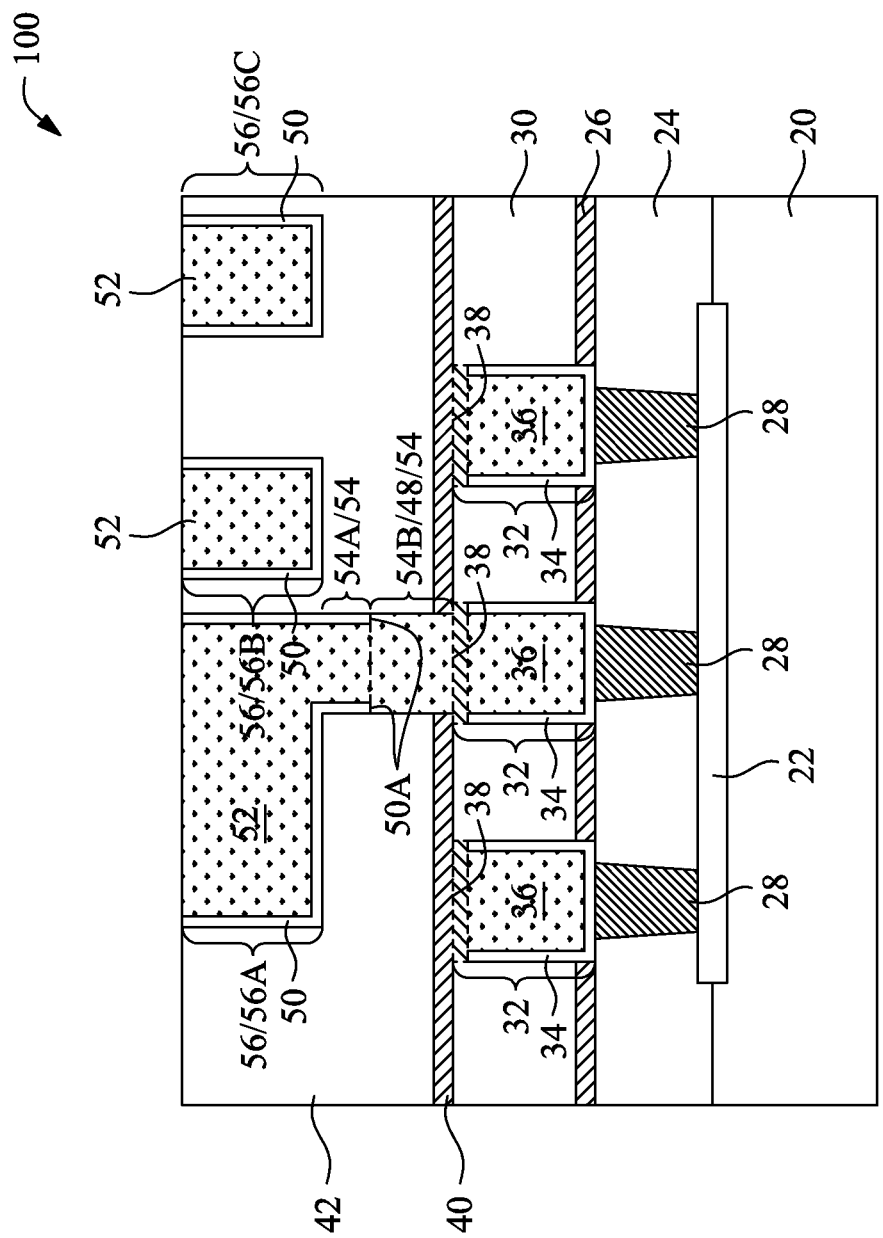

FIG. 8 illustrates the filling of conductive material 52 into the remaining via opening 44 and trenches 46 (FIG. 7), hence forming via 54 and conductive lines 56. The respective process step is shown as step 210 in the process flow shown in FIG. 14. Conductive material 52 may be a metallic material including a metal or a metal alloy such as copper, silver, gold, tungsten, aluminum, or alloys thereof. In some embodiments, the formation of via 54 and conductive lines 56 includes depositing a thin seed layer (not shown), which may include copper or a copper alloy, and filling the rest of via opening 44 and trenches 46 (FIG. 7) using, for example, ECP or electro-less plating. A deposition method may also be contemplated. A CMP may be performed to remove excess conductive material 52 and diffusion barrier layer 50, so that the top surface of conductive material 52 is level with or substantially level with the top surface of IMD layer 42.

Via 54 includes lower portion 48 (also referred to as 54B) and an upper portion 54A. Upper portion 54A includes a portion of conductive material 52 and a portion of diffusion barrier layer 50 encircling conductive material 52, wherein diffusion barrier layer 50 spaces apart, and is in contact with, conductive material 52 and IMD layer 42. Lower portion 54B does not include diffusion barrier layer 50. In some embodiments, lower portion 54B and upper portion 54A are formed of the same material (for example, with the same elements and having same percentages of the elements), and hence the lower portion 54B and upper portion 54A do not have a distinguishable interface. The bottom ends 50A of diffusion barrier layer 50 are level with or substantially level with the top surface of lower portion 54B. In alternative embodiments, lower portion 54B and upper portion 54A are formed of different materials such as different metals, and hence there is a distinguishable interface between lower portion 54B and upper portion 54A.

Each of conductive lines 56 (including 56A, 56B, and 56C) includes diffusion barrier layer 50 and conductive material 52 over a bottom portion of diffusion barrier layer 50 and encircled by the sidewall portions of diffusion barrier layer 50.

Figure 9:
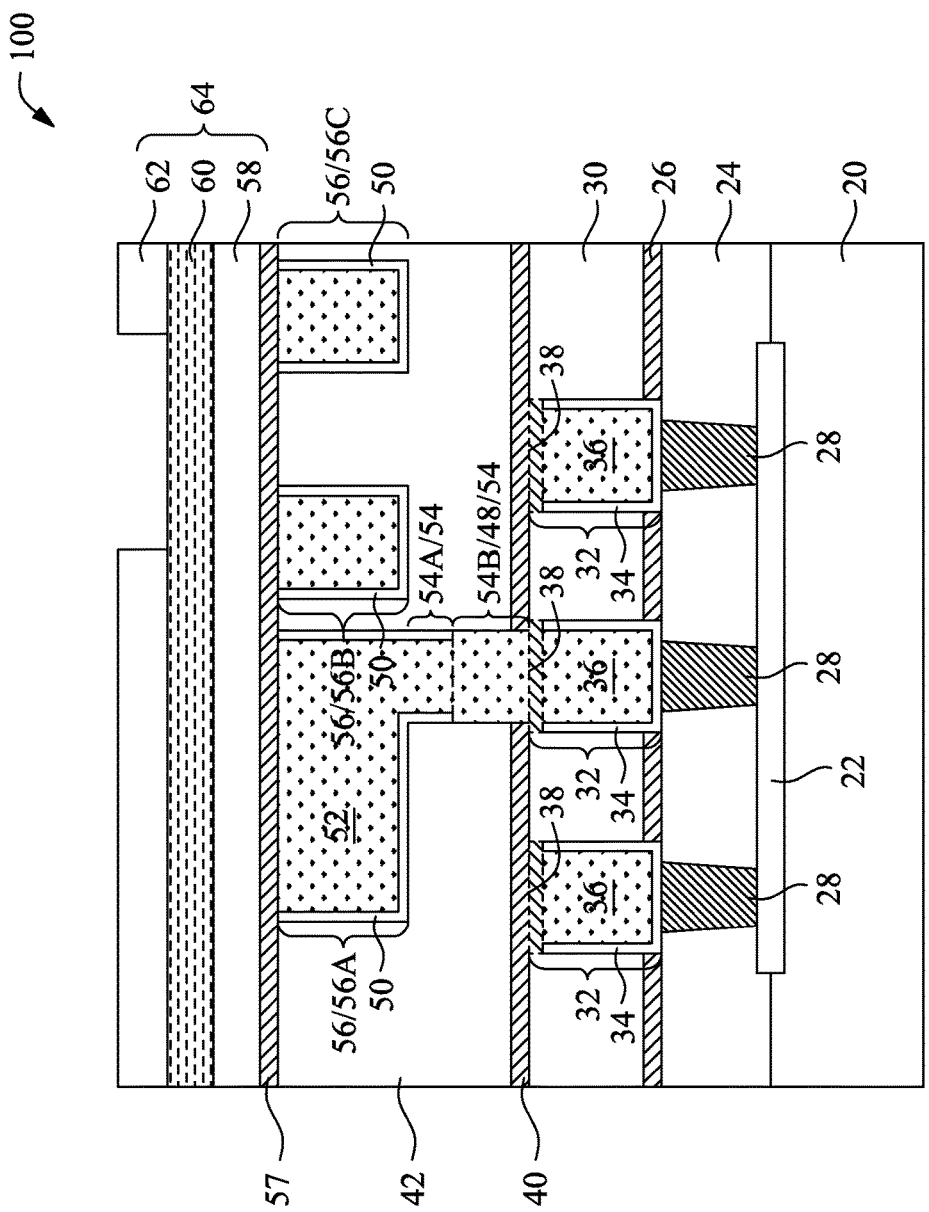
Figure 10:
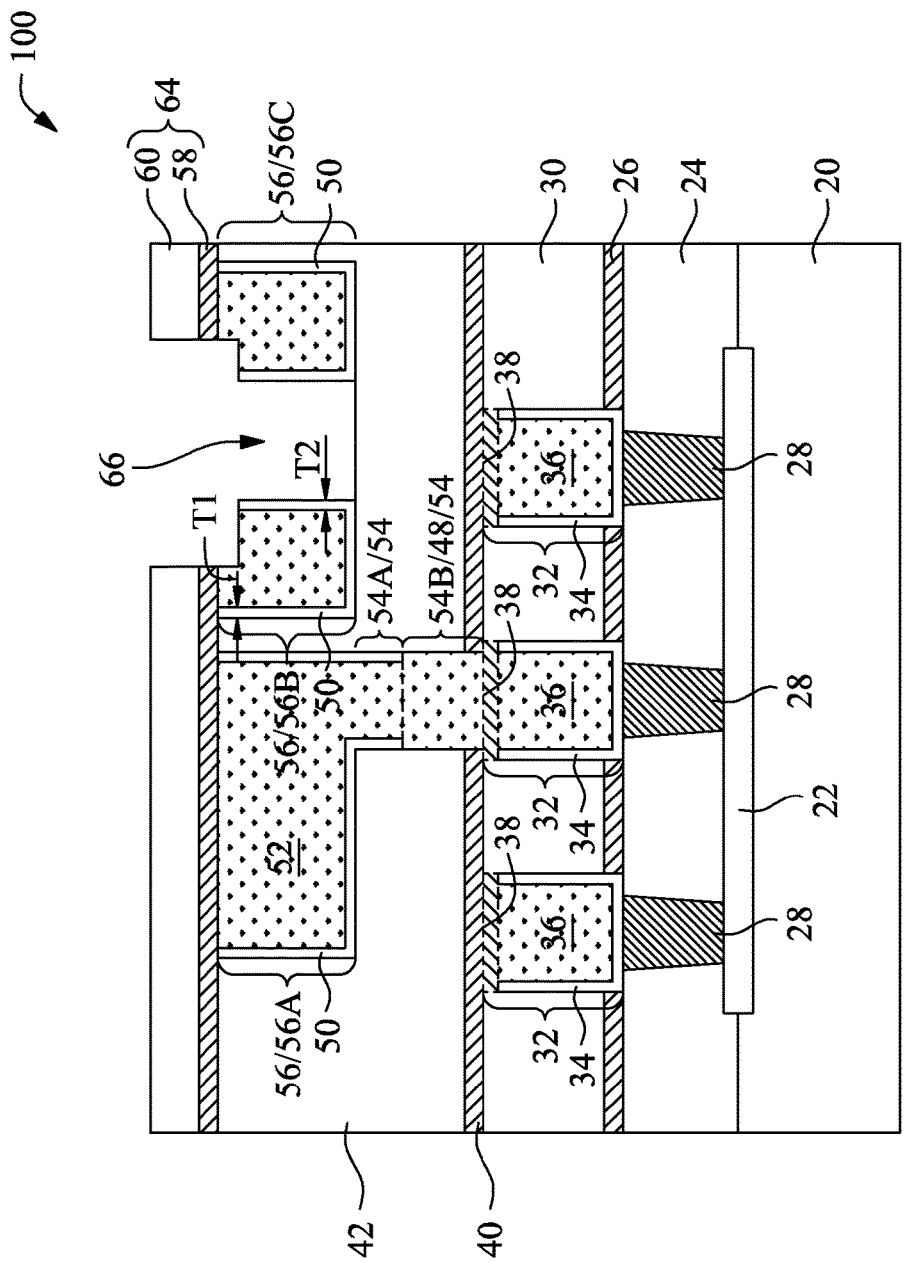
Figure 11:
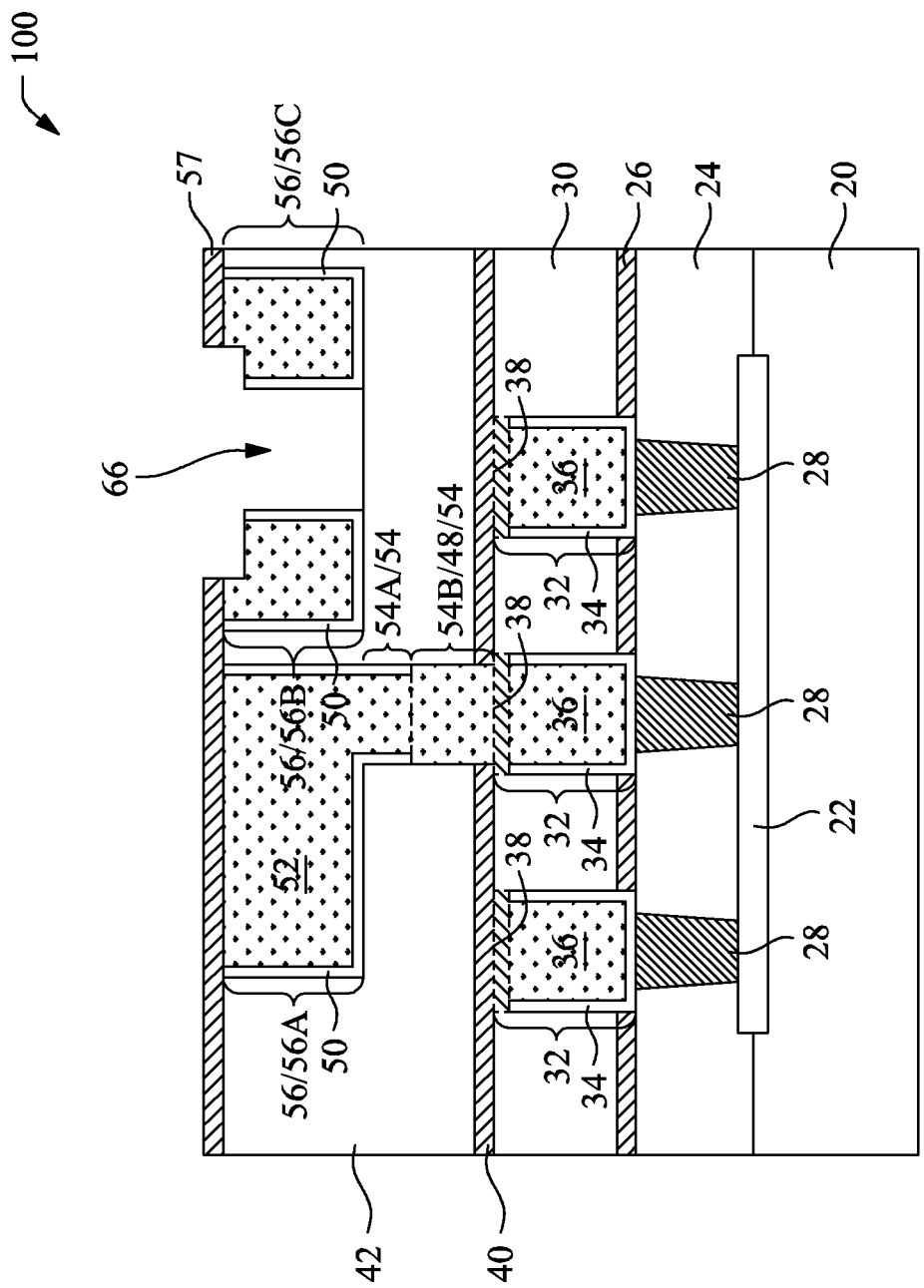

FIGS. 9 through 11 illustrate the intermediate stages in the formation of an opening between two neighboring conductive lines 56B and 56C. The respective process steps are shown as step 212 in the process flow shown in FIG. 14. Referring to FIG. 9, etch stop layer 57 is formed. Etch stop layer 57 may comprise silicon carbide, silicon nitride, silicon oxynitride, silicon carbo-nitride, or the like. Next, mask layer 64 is applied over wafer 100 and patterned. In accordance with some embodiments, mask layer 64 includes a tri-layer, which includes under layer 58, middle layer 60 over under layer 58, and upper layer 62 over middle layer 60. In alternative embodiments, mask layer 64 is a single-layer photo resist or a double-layer. In some embodiments, under layer 58 and upper layer 62 are formed of photo resists, which include organic materials. Under layer 58 may have a thickness between, for example, about 1,000 Å and about 2,000 Å. Middle layer 60 may include an inorganic material, which may be a nitride (such as silicon nitride), an oxynitride (such as silicon oxynitride), an oxide (such as silicon oxide), or the like. Middle layer 60 may also include the mix of silicon and an organic material. Middle layer 60 may have a thickness between, for example, about 300 Å and about 400 Å. Upper layer 62 may have a thickness between, for example, about 500 Å and about 700 Å. Middle layer 60 has a high etching selectivity relative to upper layer 62 and under layer 58, and hence upper layer 62 may be used as an etching mask for the patterning of middle layer 60, and middle layer 60 may be used as an etching mask for the patterning of under layer 58.

The pattern in upper layer 62 is transferred to the underlying middle layer 60 and under layer 58, which are used to etch layer 57 and IMD layer 42. The resulting structure is shown in FIG. 10, wherein upper layer 62 in FIG. 9 has been consumed. Opening 66 is formed between neighboring conductive lines 56B and 56C, which are closely located from each other. The etchant for etching IMD layer 42 is selected to have a high etching selectivity, so that in the etching of IMD layer 42, the damage to conductive lines 56B and 56C are minimized. Opening 66 may have a bottom level with or substantially level with the bottom surfaces of conductive lines 56B and 56C in some embodiments. In alternative embodiments, the bottom of opening 66 is higher than or lower than the bottom surfaces of conductive lines 56B and 56C.

Although there is a high etching selectivity, the sidewall portions of diffusion barrier layer 50 exposed to opening 66 may still be damaged. For example, thickness T2 of diffusion barrier layer 50 may be reduced from the original thickness T1. The sidewall portions of diffusion barrier layer 50 exposed to opening 66 needs to remain after the formation of opening 66 in order to function to prevent diffusion. Accordingly, thickness T1 needs to be great enough, for example, greater than about 5 nm, so that the resulting thickness T2 of the damaged portions of diffusion barrier layer 50 is greater than 0 nm, or greater than about 0.5 nm to be effective.

Figure 12:
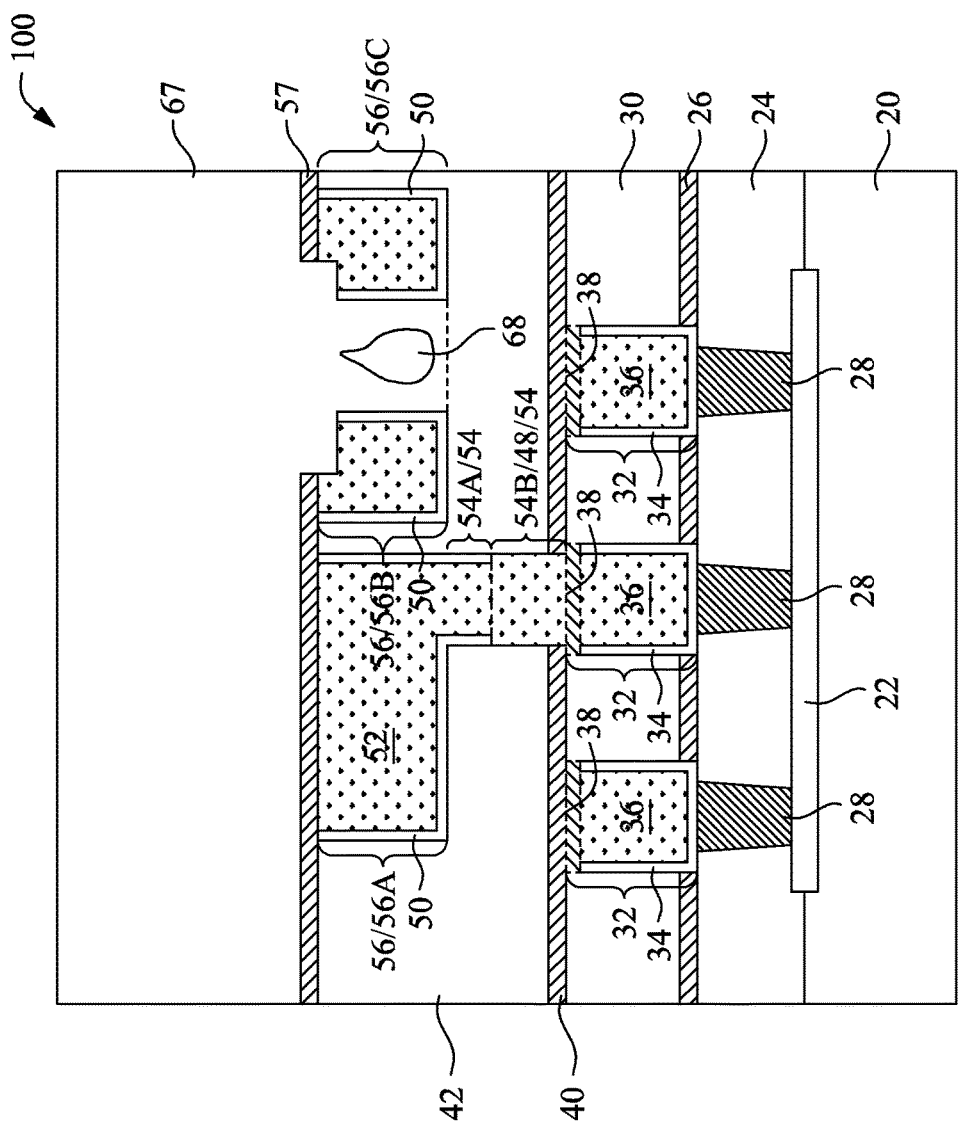

The remaining mask layer 64 is then removed, and the resulting structure is shown in FIG. 11. Next, as shown in FIG. 12, dielectric material/layer 67 and air gap 68 are formed. The respective process step is shown as step 214 in the process flow shown in FIG. 14. In accordance with some embodiments, dielectric material 67 is a low-k dielectric material, which may be selected from the same group of candidate materials of IMD layer 42. Dielectric material 67 and IMD layer 42 may also be formed of different dielectric materials. Conductive lines 56B and 56C are closely located from each other, and hence the aspect ratio of opening 66 (FIG. 11) is high. Accordingly, after the formation of dielectric layer 67, air gap 68 is formed between conductive lines 56B and 56C. The formation of dielectric material 67 may be performed using a conformal deposition method such as Chemical Vapor Deposition (CVD) in order to help the formation of air gap 68. The dielectric constant (k value) of air gap 68 is equal to 1.0, and hence the formation of air gap 68 helps reduce the parasitic capacitance between conductive lines 56B and 56C.

Figure 13:
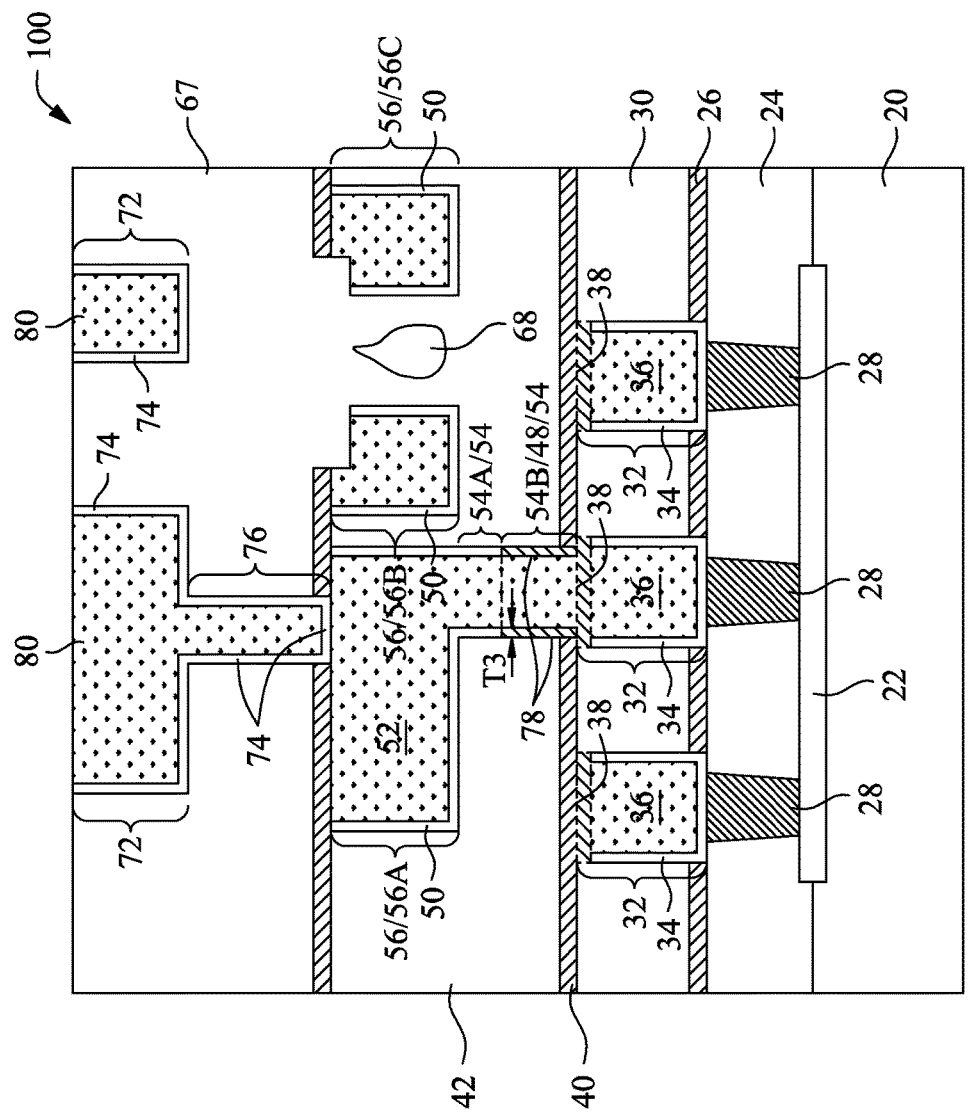
Figure 14:
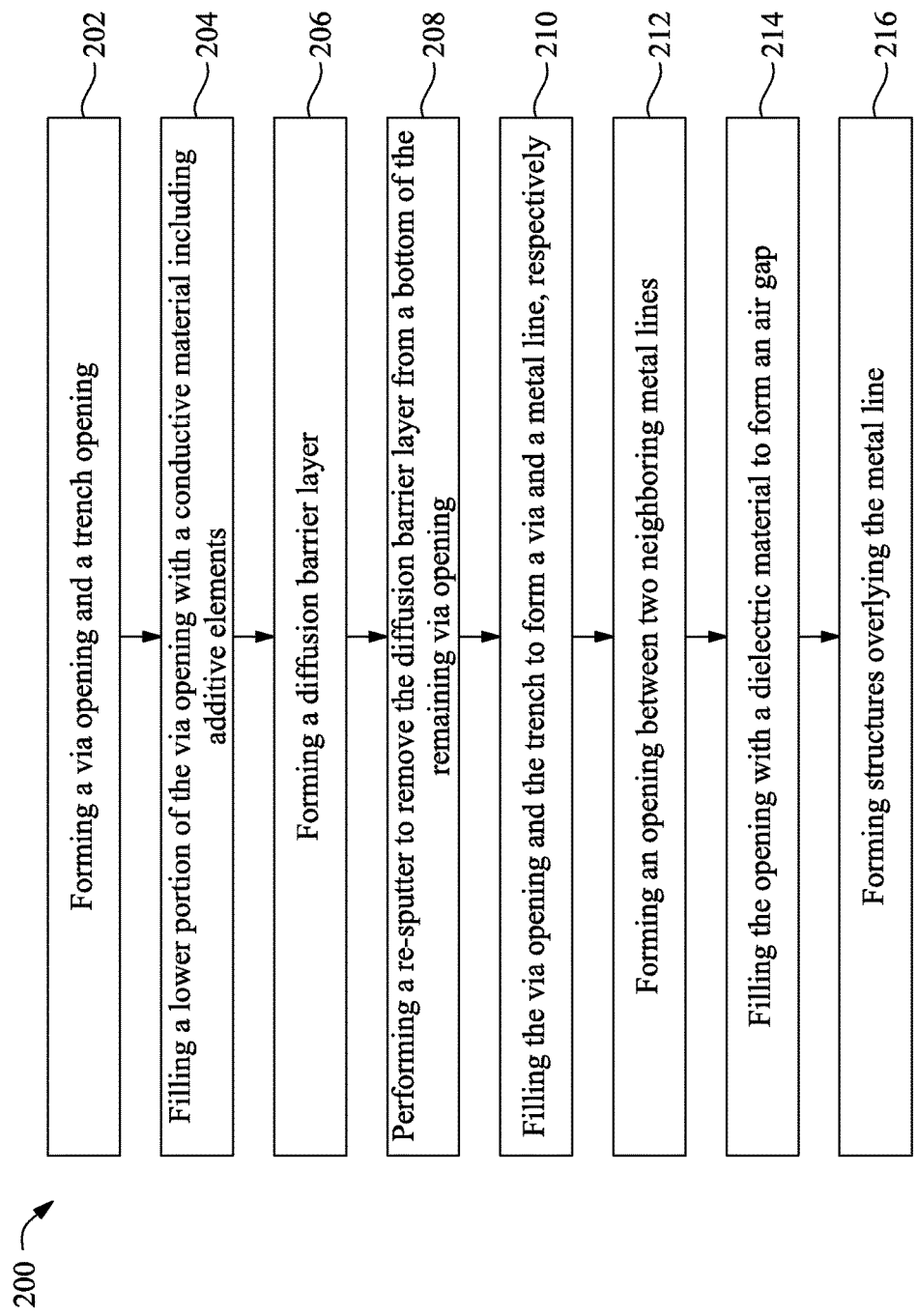
FIG. 14 illustrates a process flow for forming an interconnect structure in accordance with some embodiments.

Dielectric layer 67 also includes portions over etch stop layer 57. Dielectric layer 67 may also be another IMD layer. As shown in FIG. 13, conductive/metal lines 72 and via 76 (which include diffusion barrier layers 74 and conductive material 80) are formed over and electrically coupled to conductive lines 56. The respective process step is shown as step 216 in the process flow shown in FIG. 14. In some embodiments, the formation of metal lines 72 and via 76 is similar to the formation of conductive lines 56 and via 54, respectively, and hence the details of the formation of metal lines 72 and via 76 are not repeated herein. In some embodiments, via 76 also includes a lower portion and an upper portion formed separately similar to the formation of lower portion 54B and upper portion 54A of via 54. In alternative embodiments, since the upper metal layers have greater spacings between metal lines than lower metal layers, the parasitic capacitance between the metal lines in the upper metal layers is small. Accordingly, there will not be a separate process for forming air gaps between the metal lines in upper metal layers. Accordingly, diffusion barrier layers 74, which are parts of metal lines 72 and via 76, can extend underlying the metallic material 80 in via 76. Via 76 in these embodiments will be formed in the same process as metal lines 72, and the upper portion and the lower portion of via 76 will be formed in the same process step.

As also shown in FIG. 13, dielectric barrier layer 78 is formed encircling lower portion 54B of via 54. Dielectric barrier layer 78 is formed in a self-aligned process. For example, the formation of dielectric layer 67, metal lines 72, and via 76 may include thermal processes. If needed, additional thermal process such as a thermal anneal may be performed separately. The thermal process results in the additive elements in lower portion 54B of via 54 to diffuse to its interface with IMD layer 42, and form oxides with the elements in IMD layer 42. For example, the additive elements such as Mn, Ti, and/or Mg may form oxides with the oxygen in IMD layer 42. Hence, dielectric barrier layer 78 may include $MnO_x$, $TiO_y$, $MgO_z$, or combinations thereof, wherein values x, y, and z represent the relative atomic percentage of oxygen. Dielectric barrier layer 78 may or may not include other elements in IMD layer 42 such as carbon. Dielectric barrier layer 78 may have thickness T3 in the range from about 0.5 nm to about 2 nm.

Dielectric barrier layer 78 is self-aligned to the interface between lower via portion 54B and IMD layer 42 due to the existence of oxygen (for example) in IMD layer 42. On the other hand, between lower via portion 54B and the underlying conductive feature such as cap 38 or metal line 32, no dielectric barrier layer 78 is formed. Furthermore, dielectric barrier layer 78 is not formed around upper via portion 54A.

The embodiments of the present disclosure have some advantageous features. Air gaps are formed between metal lines to reduce the parasitic capacitance. The process for forming the air gaps, such as the etching step shown in FIG. 11, however, may result in the diffusion barrier layer to be damaged, hence compromising it function of preventing copper in metal lines from diffusing into IMD layers. The conventional way of solving this problem is to increase the thickness of diffusion barrier layers, so that the damaged diffusion barrier layers still have enough thickness. The diffusion barrier layers, however, have a low electrical conductivity, and the portions of diffusion barrier at via bottoms (whose thickness is increased) cause the contact resistance between vias and the underlying conductive lines to increase. The RC delay of the resulting interconnect structure is thus adversely increased. The embodiments of the present disclosure do not have diffusion barrier layer formed at the via bottom. As a result, the thickness of the diffusion barrier layer may be increased significantly to ensure that the damaged diffusion barrier layers still have enough thickness.

In accordance with some embodiments of the present disclosure, an integrated circuit structure includes a first conductive line, a dielectric layer over the first conductive line, a diffusion barrier layer in the dielectric layer, and a second conductive line in the dielectric layer. The second conductive line includes a first portion of the diffusion barrier layer. A via is underlying the second conductive line and electrically couples the second conductive line to the first conductive line. The via includes a second portion of the diffusion barrier layer, with the second portion of the diffusion barrier layer having a bottom end higher than a bottom surface of the via.

In accordance with alternative embodiments of the present disclosure, an integrated circuit structure includes a first conductive line, a dielectric layer over the first conductive line, a second conductive line in the dielectric layer, and a via underlying the second conductive line and electrically couples the second conductive line to the first conductive line. The via includes an upper portion and a lower portion underlying the upper portion. The upper portion further includes a conductive material and a diffusion barrier layer encircling the conductive material. A dielectric barrier layer encircles the lower portion of the via.

In accordance with yet alternative embodiments of the present disclosure, a method includes forming a dielectric layer over a conductive line, forming a trench and a via opening in the dielectric layer, with the conductive line exposed to the via opening, and filling a lower part of the via opening with a first conductive material to form a lower part of a via. After the lower part of the via is formed, a diffusion barrier layer is formed at a bottom and sidewalls of the trench. After the diffusion barrier layer is formed, an upper part of the via is formed by filling a second conductive material in the via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
    a first conductive line;
    a dielectric layer over the first conductive line;
    a diffusion barrier layer in the dielectric layer, the diffusion barrier layer comprising a first vertical portion, a horizontal portion connected at a first end to the first vertical portion, and a second vertical portion connected to the horizontal portion at a second end opposite the first end;
    a second conductive line in the dielectric layer;
    a via positioned between a bottom end of the second conductive line and an upper end of the first conductive line, the via electrically coupling the second conductive line to the first conductive line, a lower portion of the via being free of the diffusion barrier layer; and
    a dielectric barrier layer encircling the lower portion of the via, a top end of the dielectric barrier layer being joined to a bottom end of the second vertical portion of the diffusion barrier layer.

2. The integrated circuit structure of claim 1 wherein the dielectric barrier layer comprises a metal oxide.

3. The integrated circuit structure of claim 1, wherein an upper portion of the via is surrounded by a portion of the diffusion barrier layer.

4. The integrated circuit structure of claim 3, wherein the lower portion of the via and the upper portion of the via comprise different materials.

5. The integrated circuit structure of claim 1, wherein no conductive barrier layer is formed along sidewalls of the via.

6. An integrated circuit structure comprising:
    a first conductive line;
    a dielectric layer over the first conductive line;
    a second conductive line in the dielectric layer;
    a via underlying the second conductive line, the via having an upper portion and a lower portion;
    a diffusion barrier layer comprising a first vertical portion, a horizontal portion connected at a first end to the first vertical portion, and a second vertical portion connected to the horizontal portion at a second end of the horizontal portion opposite the first end of the horizontal portion, the second vertical portion encircling the upper portion of the via; and
    a dielectric barrier layer encircling the lower portion of the via, a to end of the dielectric barrier layer being joined to a bottom end of the second vertical portion of the diffusion barrier layer.

7. The integrated circuit structure of claim 6, wherein the dielectric barrier layer is between, and is in contact with, the lower portion of the via and the dielectric layer, and wherein the diffusion barrier layer is between, and is in contact with, the upper portion of the via and the dielectric layer.

8. The integrated circuit structure of claim 6, wherein the dielectric barrier layer has a bottom end substantially level with a bottom end of the lower portion of the via.

9. The integrated circuit structure of claim 6, wherein a top end of the dielectric barrier layer is joined to a bottom end of the diffusion barrier layer.

10. The integrated circuit structure of claim 6, wherein the dielectric barrier layer comprises a metal oxide.

11. The integrated circuit structure of claim 10, wherein the metal oxide is selected from the group consisting of manganese oxide, magnesium oxide, titanium oxide, and combinations thereof.

12. The integrated circuit structure of claim 6, wherein the upper portion of the via and the lower portion of the via comprise different materials.

13. An integrated circuit structure comprising:
    a dielectric layer;
    a diffusion barrier layer in the dielectric layer, the diffusion barrier layer comprising a first vertical portion, a horizontal portion connected at a first end to the first vertical portion, and a second vertical portion connected to the horizontal portion at a second end opposite the first end, each portion of the diffusion barrier layer being a same material composition;

a via in a portion of the dielectric layer, the via comprising:
  a lower portion; and
  an upper portion over and contacting the lower portion, the second vertical portion of the diffusion barrier layer encircling the upper portion, the diffusion barrier layer absent from encircling the lower portion, the upper portion and the lower portion of the via being a same material composition; and
a first metal line over and physically joined to the via, the diffusion barrier layer encircling a portion of the first metal line.

14. The integrated circuit structure of claim 13 further comprising:
  a conductive feature underlying the via, with the via electrically inter-coupling the conductive feature and the first metal line.

15. The integrated circuit structure of claim 13 further comprising:
  second metal lines, each comprising a portion of the diffusion barrier layer as an outer portion, the second metal lines being coplanar with the first metal line; and
  an air gap located between the second metal lines.

16. The integrated circuit structure of claim 13, wherein the lower portion of the via and the upper portion of the via both comprise copper, and wherein the diffusion barrier layer comprises tantalum or titanium.

17. The integrated circuit structure of claim 13, wherein outer edges of the diffusion barrier layer are aligned to respective outer edges of the lower portion of the via.

18. The integrated circuit structure of claim 13, wherein the lower portion and the upper portion of the via comprise different materials.

19. The integrated circuit structure of claim 13, wherein the lower portion of the via is wider than the upper portion of the via.

20. The integrated circuit structure of claim 13, further comprising a dielectric barrier layer encircling the lower portion of the via.

* * * * *